(12) United States Patent
Minamitani et al.

(10) Patent No.: US 7,938,929 B2
(45) Date of Patent: May 10, 2011

(54) HEATING AND PRESSURIZING APPARATUS FOR USE IN MOUNTING ELECTRONIC COMPONENTS, AND APPARATUS AND METHOD FOR MOUNTING ELECTRONIC COMPONENTS

(75) Inventors: Shozo Minamitani, Hirakata (JP); Naoto Hosotani, Osaka (JP); Koichi Morita, Schaumburg, IL (US); Syunji Onobori, Kyoto (JP); Kenichi Nishino, Osaka (JP)

(73) Assignee: Panasonic Corporation, Osaka (JP)

( * ) Notice: Subject to any disclaimer, the term of this patent is extended or adjusted under 35 U.S.C. 154(b) by 179 days.

(21) Appl. No.: 12/350,334

(22) Filed: Jan. 8, 2009

(65) Prior Publication Data

US 2009/0120998 A1    May 14, 2009

Related U.S. Application Data

(60) Division of application No. 11/235,183, filed on Sep. 27, 2005, now Pat. No. 7,490,652, which is a continuation of application No. 10/365,515, filed on Feb. 13, 2003, now abandoned, which is a division of application No. 09/554,721, filed as application No. PCT/JP98/05204 on Nov. 19, 1998, now Pat. No. 6,544,377.

(30) Foreign Application Priority Data

Nov. 20, 1997 (JP) ..................................... 9-319783

(51) Int. Cl.
| | |
|---|---|
| *B29C 65/02* | (2006.01) |
| *B29C 65/18* | (2006.01) |
| *B32B 37/06* | (2006.01) |
| *B32B 37/10* | (2006.01) |
| *C08J 5/12* | (2006.01) |
| *H05K 3/30* | (2006.01) |

(52) U.S. Cl. .................. 156/299; 156/307.1; 156/307.7; 156/308.2; 156/308.4; 29/832; 29/836; 29/740

(58) Field of Classification Search ............... 156/272.2, 156/273.3, 306.9, 323, 354, 391; 29/832, 29/833, 836, 840, 740
See application file for complete search history.

(56) References Cited

U.S. PATENT DOCUMENTS

| | | | |
|---|---|---|---|
| 3,946,931 | A | 3/1976 | Bahnck et al. |
| 4,972,990 | A | 11/1990 | Abbagnaro et al. |
| 5,172,469 | A | 12/1992 | Onda et al. |
| 5,212,880 | A | 5/1993 | Nishiguchi et al. |
| 5,439,161 | A | 8/1995 | Kawatani et al. |
| 5,698,068 | A | 12/1997 | Ichikawa et al. |

(Continued)

FOREIGN PATENT DOCUMENTS

EP    0 487 336    5/1992

(Continued)

*Primary Examiner* — Philip C Tucker
*Assistant Examiner* — Sing P Chan
(74) *Attorney, Agent, or Firm* — Wenderoth, Lind & Ponack, L.L.P.

(57) ABSTRACT

A heating and pressurizing apparatus (101), to which a circuit board (70) with electronic components (8) pre-bonded thereto via bonding elements (9) is carried in, is provided. The heating and pressurizing apparatus post-bonds the electronic component to the circuit board by heating and pressurizing the electronic component by a contact member (1211) having a heating device (122). By executing the pre-bonding and the post-bonding of the electronic components to the circuit board independently of each other, the time required for the post-bonding can be reduced, compared with the conventional case, and the productivity of the whole mounting line can be improved.

8 Claims, 10 Drawing Sheets

U.S. PATENT DOCUMENTS 6,006,426 A    12/1999   Kira et al.

FOREIGN PATENT DOCUMENTS

| | | |
|---|---|---|
| JP | 61-158153 | 7/1986 |
| JP | 03-046244 | 2/1991 |
| JP | 03-104134 | 5/1991 |
| JP | 04-352442 | 12/1992 |
| JP | 05-002177 | 1/1993 |
| JP | 06-151500 | 5/1994 |
| JP | 07-201932 | 8/1995 |
| JP | 07-288267 | 10/1995 |
| JP | 08-114811 | 5/1996 |
| JP | 08-114812 | 5/1996 |
| JP | 08-125316 | 5/1996 |
| JP | 08-184847 | 7/1996 |
| JP | 09-043622 | 2/1997 |
| JP | 09-167786 | 6/1997 |

HEATING AND PRESSURIZING APPARATUS FOR USE IN MOUNTING ELECTRONIC COMPONENTS, AND APPARATUS AND METHOD FOR MOUNTING ELECTRONIC COMPONENTS

This application is a Divisional application of Ser. No. 11/235,183, filed on Sep. 27, 2005 (now U.S. Pat. No. 7,490,652), which is a Continuation application of Ser. No. 10/365,515, filed on Feb. 13, 2003 (now abandoned), which is a Divisional application of Ser. No. 09/554,721, filed May 18, 2000 (now U.S. Pat. No. 6,544,377), which is the National Stage Application of International Application No. PCT/JP98/05204, filed Nov. 19, 1998.

TECHNICAL FIELD

The present invention relates to a heating and pressurizing apparatus for use in mounting electronic components. Using the apparatus, an electronic component pre-bonded onto a circuit board in a flip chip manner via a bonding element that needs heating and pressurizing is pressurized and heated, thereby making the bonding element cured so that the electronic component is post-bonded. The invention also relates to an electronic component mounting apparatus equipped with the heating and pressurizing apparatus, as well as an electronic component mounting method.

BACKGROUND ART

In recent years, the flip-chip mounting of ICs has been rapidly becoming widespread with views to thinner and smaller circuit boards with the pervasion of portable information terminals. In addition, in SAW (Surface Acoustic Wave) devices used for mobile phones, the flip-chip mounting is also beginning to rapidly prevail.

However, for the flip-chip mounting technique, unlike the conventional mounting technique, various connection methods are available and the present situation is that companies in the art are employing various methods, while groping thereabout, in terms of intellectual property rights, reliability, and the like. Among these methods, there has been a rapid increase in cases where heating and pressurizing are involved in the process of post-bonding with adhesive, ACF, or the like from the aforementioned point of view. An example of such a conventional heating and pressurizing method is described below with reference to the accompanying drawings.

FIG. 9 is an explanatory view of the flip-chip mounting process using the conventional heating and pressurizing method. In FIG. 9, reference numeral 1 denotes a nozzle for holding an electronic component 8 by suction, numeral 4 denotes a heating part for curing a bonding element 9, and numeral 6 denotes a table part on which a circuit board 7 is to be placed. In such a constitution, the bonding element 9 is previously applied to a mounting portion on the circuit board 7 where the electronic component 8 is to be mounted, and the circuit board 7 with the bonding element 9 is fixed onto the table part 6. Then, the table part 6 moves, so that the mounting portion is placed just under the nozzle 1. After that, the nozzle 1 moves down so that the electronic component 8 is mounted to the mounting portion via the bonding element 9. Then, while the electronic component 8 is pressurized against the circuit board 7 by the nozzle 1, the bonding element 9 is cured by heat generation of the heating part 4.

With the flip-chip mounting by using a heating and pressurizing technique of the conventional method as described above, it takes about 7 seconds for the circuit board 7 in which the bonding element 9 has previously been applied to the electronic-component mounting portion to be carried into the flip-chip mounter. The electronic components 8 are then mounted in about 7 seconds per electronic component, and about 60 seconds are required for the heating and pressurizing time for curing the bonding element 9 in the mounting process. Afterwards, the next circuit board 7 takes 7 seconds to be carried into the mounter successively, and a similar production operation is iterated. Therefore, when one electronic component 8 is flip-chip-mounted onto one circuit board 7, the production cycle time for each circuit board 7 is about 74 seconds.

However, in the above conventional process, although electronic components can be flip-chip-mounted onto the circuit board with high precision and high speed in the flip-chip mounter, the production rate comes to an abrupt fall because the heating and pressurizing operation for curing the bonding element 9 is also executed in the flip-chip mounter, prolonging the time required for the whole mounting process.

SUMMARY OF THE INVENTION

The present invention has been developed to solve such issues. Therefore, an object of the invention is to provide a heating and pressurizing apparatus for use in mounting electronic components, as well as an electronic component mounting apparatus equipped with the heating and pressurizing apparatus, and an electronic component mounting method. The present invention is capable of increasing to a maximum the production cycle efficiency of the mounting apparatus for flip-chip-mounting electronic components onto the circuit board, and of improving the productivity of the whole flip-chip mounting line.

In accomplishing these and other aspects, according to a first aspect of the present invention, there is provided an electronic component mounting method for producing a plurality of circuit boards, in which an electronic component pre-bonded on each circuit board of the boards via a bonding element is heated and pressurized so as to be post-bonded. The method comprises pre-bonding the electronic component onto each circuit board by a first unit; and post-bonding the pre-bonded electronic component on the circuit board by a second unit which is separate from and independent of the first unit (i.e., they can operate at different rates).

According to a second aspect of the present invention, there is provided an electronic component mounting method according to the first aspect, wherein the pre-bonding and the post-bonding are executed simultaneously. A plurality of the pre-bonded circuit boards produced by the pre-bonding are stored in a storage container and fed to the post-bonding in units of the storage container.

According to a third aspect of the present invention, there is provided an electronic component mounting method according to the first aspect, wherein the pre-bonding and the post-bonding are executed simultaneously, and the pre-bonded circuit boards produced by the pre-bonding are fed to the post-bonding one by one.

According to a fourth aspect of the present invention, there is provided an electronic component mounting apparatus for producing a plurality of circuit boards, in which an electronic component pre-bonded (i.e., primarily-bonded) on each circuit board of the boards via a bonding element is heated and pressurized so as to be post-bonded (i.e., secondarily bonded). The apparatus comprises a pre-bonding unit for pre-bonding the electronic component onto each circuit board; and an electronic-component post-bonding unit which is separate from and independent of the pre-bonding unit and operates simultaneously with the pre-bonding unit. The post-bonding unit heats and pressurizes the pre-bonded electronic component so that the pre-bonded electronic component is post-bonded on the circuit board.

According to a fifth aspect of the present invention, there is provided an electronic component mounting apparatus according to the fourth aspect, further comprising a carrying unit for carrying the circuit board produced by the pre-bonding unit (with the electronic component pre-bonded thereon) from the pre-bonding unit to the post-bonding unit.

According to a sixth aspect of the present invention, there is provided a heating and pressurizing apparatus for use in mounting electronic components, comprising a placement table for placing thereon a circuit board on which an electronic component has been pre-bonded via a bonding element applied onto the circuit board. The apparatus also comprises a mounting finishing unit which is provided separately from the placement table and which heats the electronic component pre-bonded onto the circuit board placed on the placement table and pressurizes the electronic component in a direction of thickness of the circuit board. Thus, the electronic component is post-bonded on the circuit board.

According to a seventh aspect of the present invention, there is provided a heating and pressurizing apparatus for use in mounting electronic components according to the sixth aspect, wherein the mounting finishing unit comprises a pressurizing device which has a contact member having a contact surface to be brought into contact with the pre-bonded electronic component. The pressurizing device moves the contact member in the direction of thickness of the circuit board to press the pre-bonded electronic component against the circuit board. A heating device heats the contact member to post-cure the bonding element.

According to an eighth aspect of the present invention, there is provided a heating and pressurizing apparatus for use in mounting electronic components according to the seventh aspect. The pressurizing device further comprises a parallelism adjuster for adjusting parallelism between the contact surface of the contact member and the pre-bonded electronic component; and a pressurizing-force adjuster for adjusting the pressurizing force of the contact member.

According to a ninth aspect of the present invention, there is provided a heating and pressurizing apparatus for use in mounting electronic components according to any one of the sixth to eighth aspects. The placement table has a placement-table heating device which is movable in both X and Y directions each perpendicular to the direction of thickness of the circuit board and which serves an auxiliary role in curing the bonding element.

According to a tenth aspect of the present invention, there is provided a heating and pressurizing apparatus for use in mounting electronic components according to any one of the seventh to ninth aspects. Assuming that the contact member, the heating device, and the pressurizing device are taken as one set, the mounting finishing unit has a plurality of sets of the contact member, the heating device, and the pressurizing device, each set being operative independently of one another.

According to an 11th aspect of the present invention, there is provided a heating and pressurizing apparatus for use in mounting electronic components according to any one of the 7th to 10th aspects, wherein the heating device comprises a ceramic heater for reducing temperature-increasing time and cooling time.

According to a 12th aspect of the present invention, there is provided a heating and pressurizing apparatus for use in mounting electronic components according to any one of the 6th to 11th aspects, wherein the mounting finishing unit further comprises a contamination-preventing member supply unit. When the contact member pressurizes the electronic component, the contamination-preventing member supply unit supplies a contamination preventing member for preventing a contact surface of the contact member from being contaminated by the bonding element so that the contamination preventing member is interposed between the contact surface and the electronic component.

According to a 13th aspect of the present invention, there is provided a heating and pressurizing apparatus for use in mounting electronic components according to the 12th aspect, wherein the contamination preventing member is formed of a sheet material.

According to a 14th aspect of the present invention, there is provided a heating and pressurizing apparatus for use in mounting electronic components according to any one of the 6th to 13th aspects, wherein the placement table is equipped with a fixing unit for positioning and fixing the circuit board.

According to a 15th aspect of the present invention, there is provided a heating and pressurizing apparatus for use in mounting electronic components according to any one of the 6th to 14th aspects, wherein the heating and pressurizing apparatus comprises a plurality of the units, assuming that the placement table and the mounting finishing unit are taken as each unit of the units.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
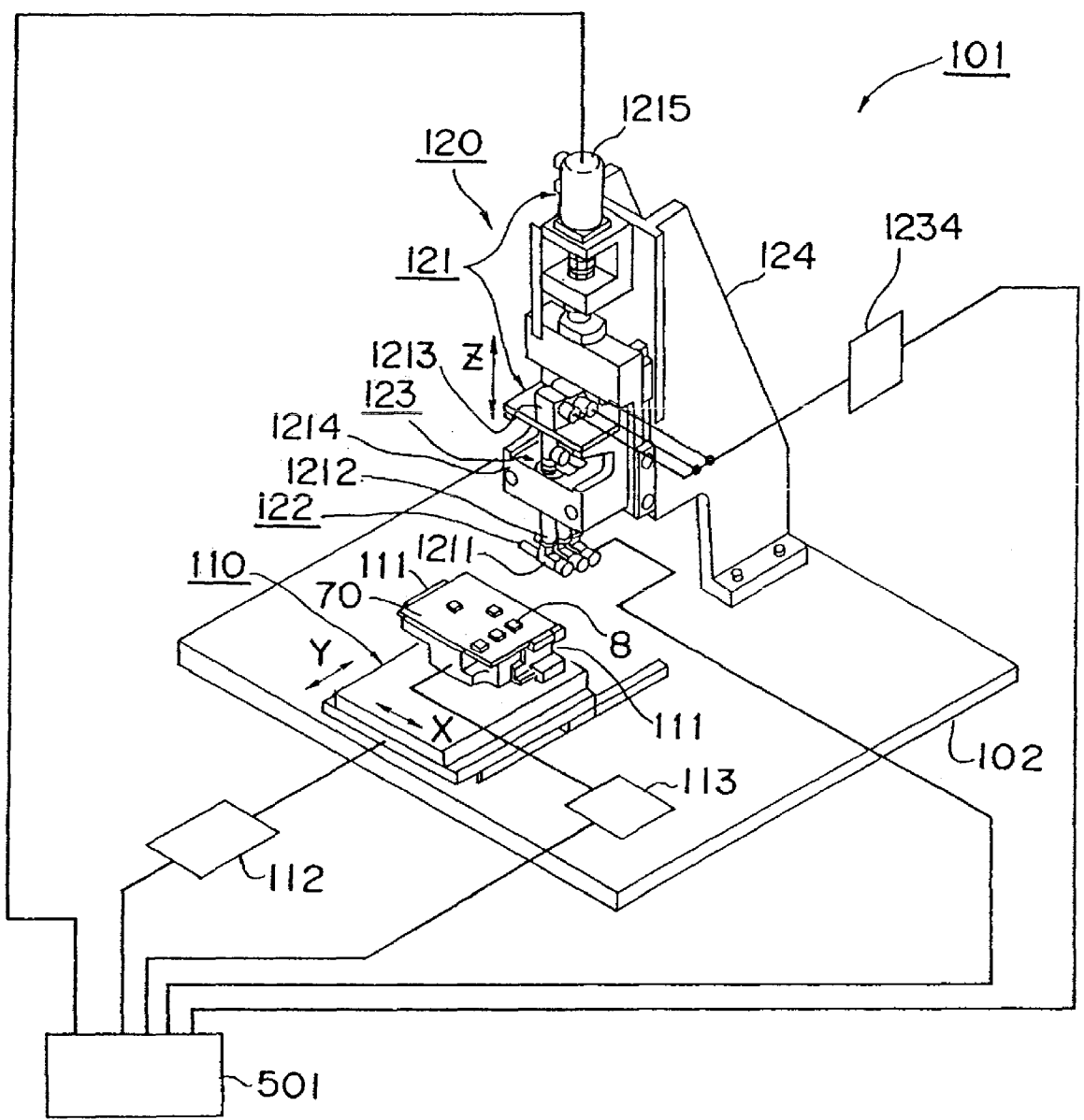
FIG. 1 is a perspective view of a heating and pressurizing apparatus according to an embodiment of the present invention.

Before the description of the present invention proceeds, it is to be noted that like parts are designated by like reference numerals throughout the accompanying drawings.

A heating and pressurizing apparatus for use in mounting electronic components, an electronic component mounting apparatus equipped with this heating and pressurizing apparatus for use in mounting electronic components, and an electronic component mounting method to be executed by using this heating and pressurizing apparatus for use in mounting electronic components, which are an embodiment of the present invention, are described below with reference to the accompanying drawings. Throughout the drawings, like component parts are designated by like reference numerals. In this embodiment, a flip-chip mounter is taken as an example for fulfilling the function of the pre-bonding unit.

Figure 5:
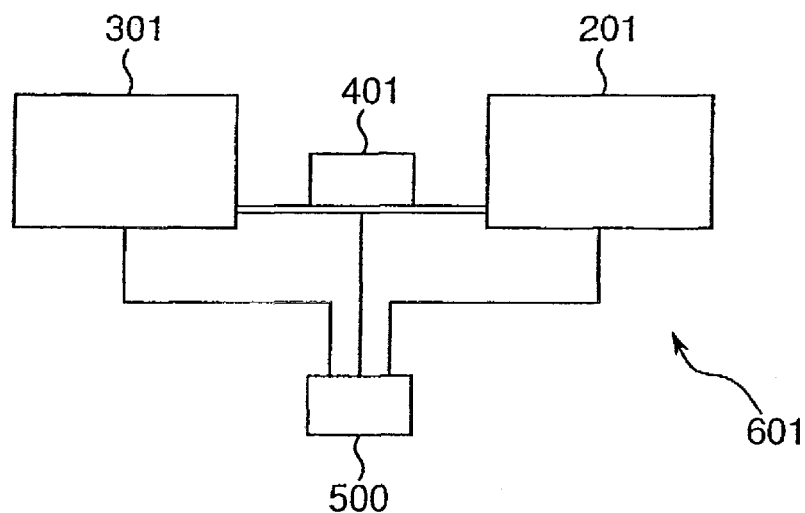
FIG. 5 is a block diagram of an electronic component mounting apparatus which is an embodiment of the present invention and which is equipped with the post-bonding unit shown in FIG. 4.
Figure 10:
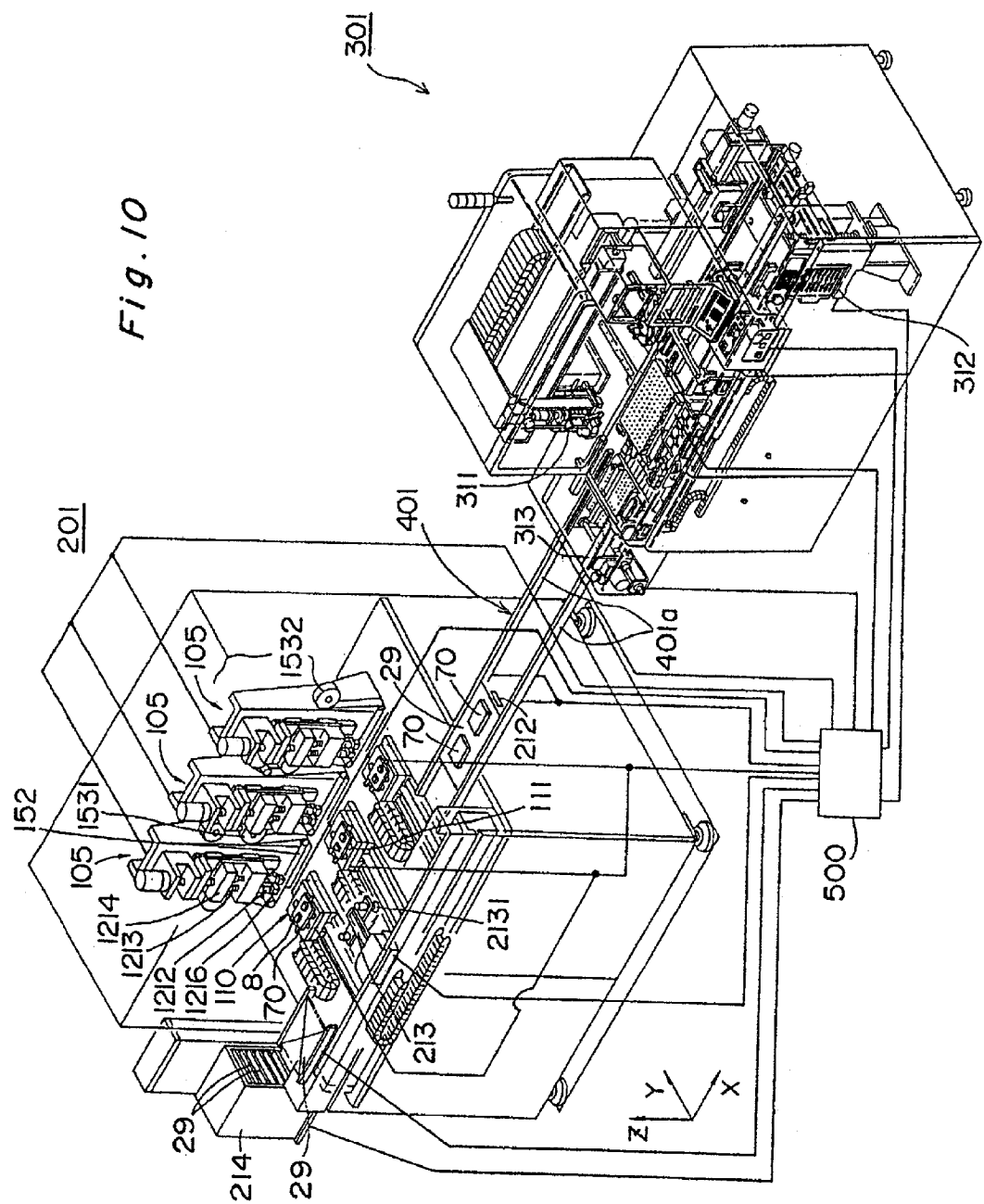
FIG. 10 is a perspective view showing a specified electronic component mounting apparatus of FIG. 5 wherein the final fixing unit shown in FIG. 4 and the flip-chip mounter shown in FIG. 7 are directly connected via the carrying unit.

The electronic component mounting apparatus 601, as shown in FIGS. 5 and 10, comprises a flip-chip mounter 301, a carrying unit 401, an electronic-component post-bonding unit 201, and a control unit 500.

Figure 7:
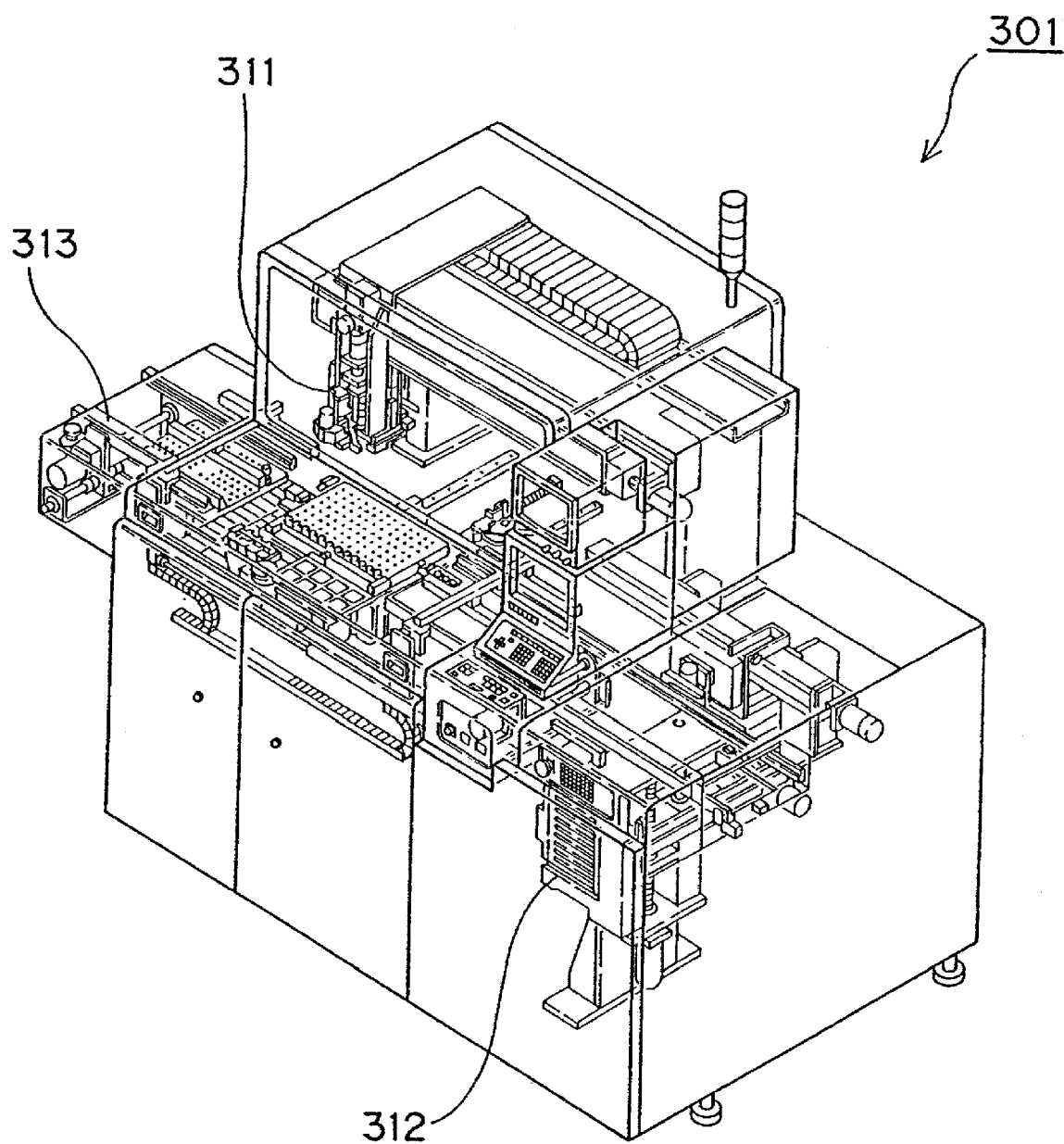
FIG. 7 is a view showing the flip-chip mounter shown in FIG. 5.

The flip-chip mounter 301 is fed circuit boards 70, in each of which a bonding element 9 has been applied to a component mounting portion on the circuit board 70 as in the prior art. The flip-chip mounter 301 performs the mounting of electronic components 8 to the circuit boards 70, serving only for the pre-bonding of the electronic components 8. That is, the flip-chip mounter 301 does not perform the heating and pressurizing operation for the electronic components 8 as would be done in the prior art. The constitution of such a flip-chip mounter 301 is shown in FIG. 7. In the flip-chip mounter 301, reference numeral 311 denotes a component mounting head for executing the mounting of the electronic components 8 onto the circuit boards 70, numeral 312 denotes a storage rack for storing the circuit boards 70, and numeral 313 denotes a transfer unit for transferring the circuit boards on which the electronic components 8 are mounted.

The carrying unit 401 is a known device for carrying to the post-bonding unit 201 the circuit boards 70 which have been produced by the flip-chip mounter 301 and on which the electronic components 8 have been pre-bonded. The method for carrying the circuit boards 70 may be a method that when a specified number of circuit boards 70 are produced and stored, these circuit boards 70 are carried. Alternatively, each circuit board 70 may be carried one by one each time a circuit board 70 is produced, or the like. Thus, the rate of pre-bonding the electronic components by the flip-chip mounter 301 can be different (i.e., is independent of) the rate of post-bonding the pre-bonded electronic components using the post-bonding unit 201. The post-bonding unit 201, to which each circuit board 70 is fed, performs heating and pressurizing operations on the electronic components 8 pre-bonded to the circuit board(s) 70 so that the electronic components 8 are post-bonded to the circuit board(s) 70.

As shown above, in the electronic component mounting apparatus 601 of this embodiment, the operation of pre-bonding an electronic component 8 to the circuit board 70, and the operation of post-bonding the electronic component 8, are executed by independent units, respectively, where the pre-bonding operation and the post-bonding operations are executed simultaneously. Therefore, the time required to pre-bond the electronic component 8 to the circuit board 70 by the flip-chip mounter 301, like the foregoing conventional case, is 14 seconds resulting from adding up 7 seconds required for the carriage-in operation of the circuit board 70, and 7 seconds required for the mounting operation of the electronic component 8. Also, the time required to post-bond the electronic component 8 to the circuit board 70 by the post-bonding unit 201 is 67 seconds resulting from adding up 7 seconds required for the carriage-in operation of the circuit board 70, and 60 seconds that is the heating and pressurizing time. Although the time required for the pre-bonding operation and the post-bonding operation remains the same as in the conventional case, this embodiment allows the two operations to be executed independently and simultaneously so that the production cycle time required for both pre-bonding and post-bonding of the electronic component 8 is 67 seconds.

Figure 6:
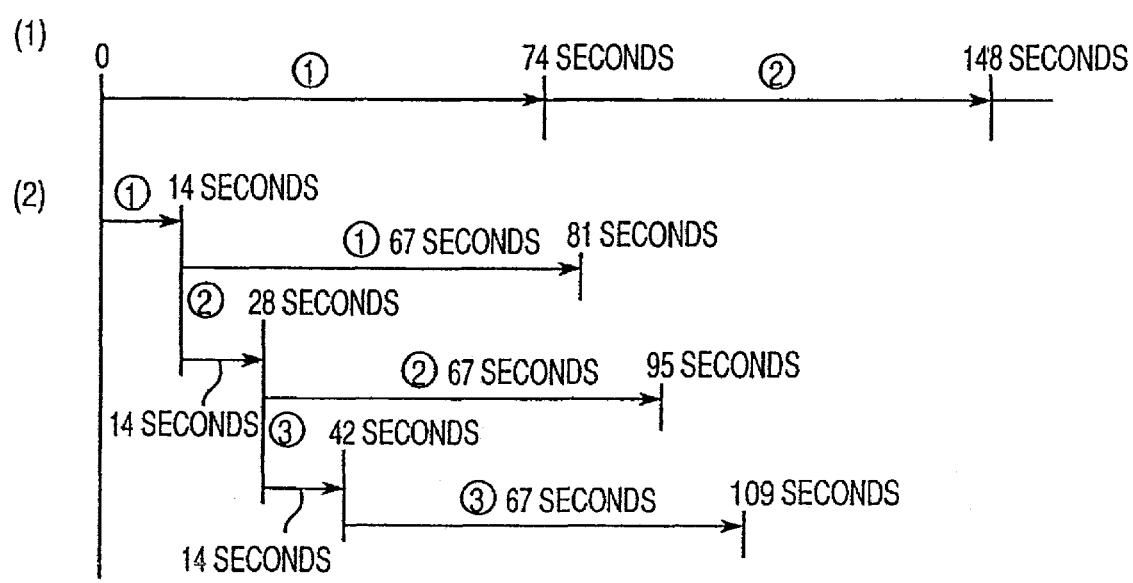
FIG. 6 is a timing chart for explaining the production cycle time in the electronic component mounting apparatus shown in FIG. 5.

More specifically, in the prior art, as shown in FIG. 6 (1), because pre-bonding and post-bonding operations of the electronic component 8 would be executed by one unit, the time required to complete the pre-bonding and the post-bonding for one circuit board would be 74 (=14+60) seconds for the first board, 148 (=74×2) seconds for the second board, and so on. Meanwhile, in this embodiment, as shown in FIG. 6 (2), although the time required to complete the post-bonding for the first circuit board 70 is 81 seconds resulting from adding 14 seconds and 67 seconds up as shown above, the flip-chip mounter 301 produces the circuit board 70 with the electronic components 8 pre-bonded thereon in steps of 14 seconds, so that the time required to complete the post-bonding for the second circuit board 70 is no more than 95 seconds resulting from adding 28 (=above 14×2) seconds and above 67 seconds up, counting from the processing-start point. Similarly, the time required to complete the post-bonding for the third circuit board 70 is no more than 109 seconds, which results from adding 42 (=above 14×3) seconds and above 67 seconds up, the time required to complete the post-bonding for the fourth circuit board 70 is 123 seconds, and the time required to complete the post-bonding for the fifth circuit board 70 is 137 seconds. Like this, for example within a time duration (148 seconds) that allows the operations up to the post-bonding for two circuit boards 70 to be achieved in the prior art, this embodiment allows the operations up to the post-bonding for five circuit boards 70 to be achieved.

In addition, the control unit 500 is connected to the flip-chip mounter 301, the carrying unit 401, and the post-bonding unit 201, and performs the aforementioned operation control as the electronic component mounting apparatus 601. The control unit 500 is also connected to later-described control units 501, 502, and 220, and performs integrated control of these control units 501, 502, and 220. Otherwise, processing operations of the control units 501, 502, and 220 may be executed by the control unit 500, in which case the control units 501, 502, 220 may be omitted.

Next, the heating and pressurizing apparatus for use in mounting electronic components provided in the above electronic-component post-bonding unit 201 is explained.

As shown in FIG. 1, the heating and pressurizing apparatus 101 for use in mounting electronic components comprises a placement table 110 and a mounting finishing unit 120. The placement table 110 supports thereon the circuit board 70 on which electronic components 8 have previously been pre-bonded by flip mounting via the bonding element 9 applied onto the circuit board 70. Also, the placement table 110 is equipped with a fixing unit 111 for positioning and fixing the circuit board 70 to a specified position by, for example, pinching the circuit board 70 at both longitudinal end portions. The placement table 110 of such an arrangement can be slid by a drive unit 112 in X, Y directions perpendicular to each other on a plane, and the drive unit 112 moves the placement table 110 in the X, Y directions so that the electronic components 8 on the circuit board 70 are heated and pressed successively by the mounting finishing unit 120, which is detailed below. The placement table 110 is further provided with a placement-table heating device 113 for preliminarily heating the bonding element 9 via the placed circuit board 70.

The mounting finishing unit 120 is a unit which is provided separately from the placement table 110, and which heats the electronic component 8 pre-bonded to the circuit board 70 placed on the placement table 110, while pressing the electronic component 8 in the thicknesswise direction of the circuit board 70 (i.e., against the circuit board 70), thereby post-bonding the electronic component 8 to the circuit board 70. The mounting finishing unit 120 roughly comprises a pressurizing device 121 and a heating device 122. The pressurizing device 121 presses the electronic component 8 placed on the circuit board 70 placed on the placement table 110 against the circuit board 70, and comprises a contact member 1211, a parallelism adjusting mechanism 1212, a pressurizing-force adjusting mechanism 1213, a support member 1214, and a support-member drive unit 1215. In addition, the support member 1214 can be moved by the support-member drive unit 1215 in the thicknesswise direction equivalent to Z direction perpendicular to the X, Y directions (i.e., perpendicular to the plane of circuit board 70).

Figure 8:
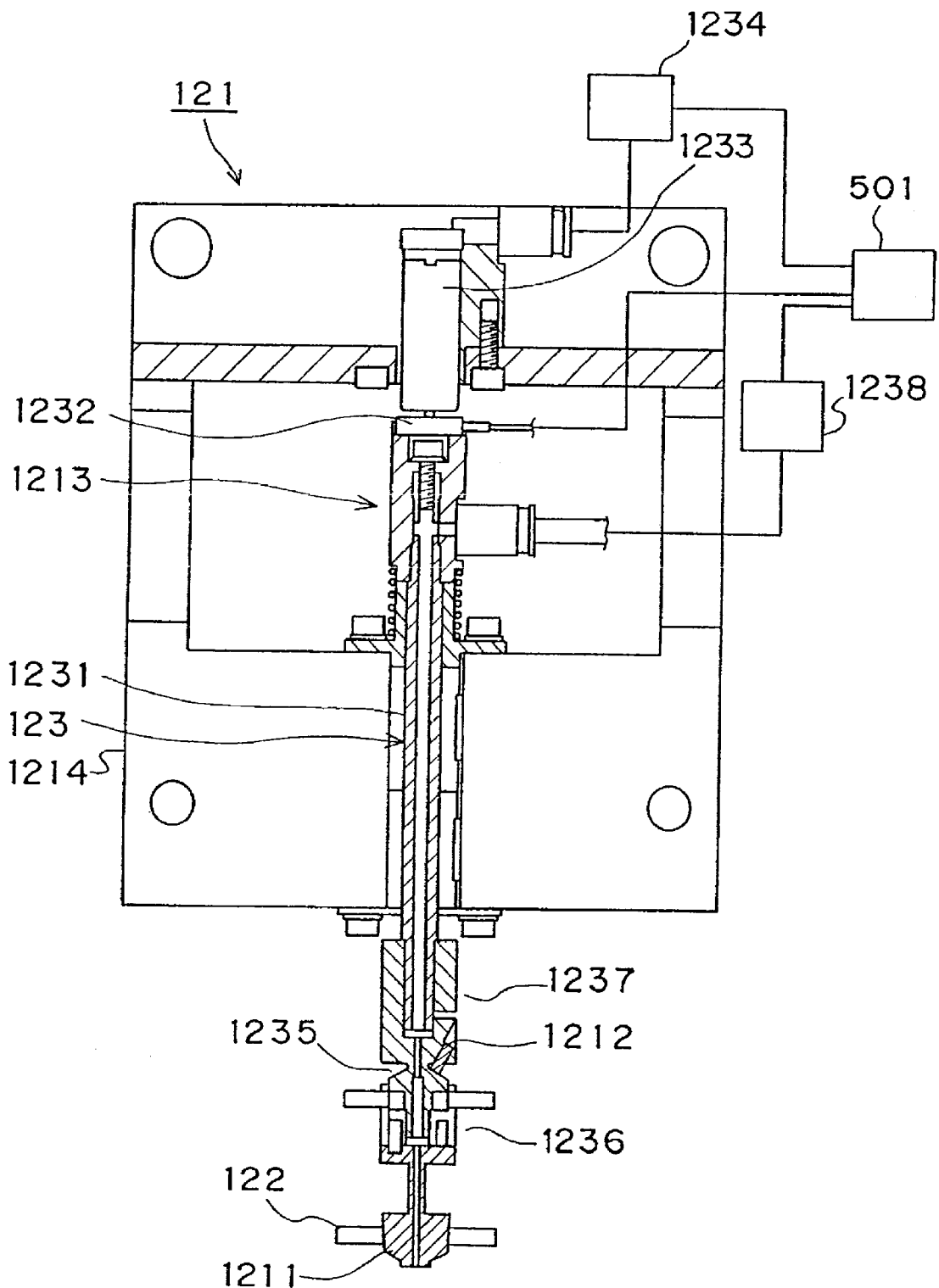
FIG. 8 is an enlarged sectional view of the pressure nozzle part provided in the heating and pressurizing apparatus shown in FIG. 1 through FIG. 3.

In this embodiment, the support member 1214 is provided with three pressure nozzles 123, and FIG. 8 shows the structure of one pressure nozzle 123. Each pressure nozzle 123 comprises the contact member 1211, the parallelism adjusting mechanism 1212, and the pressurizing-force adjusting mechanism 1213, and is supported by the support member 1214 in a state of being movable in the thicknesswise direction. As illustrated in the figure, a spline nozzle 1231 extends along the Z direction, and the spline nozzle 1231 is axially and slidably supported by the support member 1214. With regard to the spline nozzle 1231, the contact member 1211 is fitted to one end, and the pressurizing-force adjusting mechanism 1213 is fitted to the other end via a load cell 1232. In addition, the planar shape of the contact member 1211 is a shape nearly coincident with the planar shape of the electronic component 8 to be thereby pressurized.

The pressurizing-force adjusting mechanism 1213 comprises an air cylinder 1233, and an electropneumatic regulator 1234 to be connected to the air cylinder 1233. The air cylinder 1233 is fixed to the support member 1214 so that the piston of the air cylinder 1233 comes into contact with the load cell 1232. The electropneumatic regulator 1234 is connected to the control unit 501, and supplies to the air cylinder 1233 air of a pressure corresponding to a pressurization control signal fed from the control unit 501. As will be described later, in the operation of pressurizing the electronic component 8 against the circuit board 70, the support member 1214 is lowered in the Z direction by the support-member drive unit 1215, and continues being lowered while the contact member 1211 is kept in contact with the electronic component 8. As a result, the spline nozzle 1231, by its reaction, pushes up against the piston of the air cylinder 1233 on which the air pressure is acting. The pressurizing force to the electronic component 8 in this case can be controlled by the control unit 501 by the lowering extent in the support-member drive unit 1215, and the pressurizing operation is further controlled by the control unit 501 also by the pressing force obtained via the load cell 1232.

The parallelism adjusting mechanism 1212 is constructed in the following way. A boundary portion between a head portion 1236 and a trunk portion 1237 in an end portion of the spline nozzle 1231 to which the contact member 1211 is fitted, as shown in the figure, has a narrow portion 1235 formed narrower than the trunk portion 1237. In this embodiment, the diameter of the narrow portion is about 3 to 4 mm. Therefore, the head portion 1236 can be swung relatively easily with respect to the trunk portion 1237. Thus, adjustment screws are screwed into the trunk portion 1237 at three points with equal intervals along the periphery of the trunk portion 1237, where the end of each adjustment screw can contact the head portion 1236. As a result, the head portion 1236 can be swung by adjusting the extent to which the adjustment screws are screwed in, so that the parallelism between the electronic component 8 and the contact surface of the contact member 1211 fitted to the head portion 1236 can be adjusted by the swing of the head portion 1236. By adjusting the parallelism in this way, all the bumps provided in the electronic component 8 can be pressed against the circuit board 70 with uniform pressing force. In this embodiment, as described above, the mechanism including the adjustment screws corresponds to the aforementioned parallelism adjusting mechanism.

In addition, as will be described later, an air passage may be defined within the spline nozzle 1231 along its axial direction so as to enable a sucking operation by the contact member 1211. In this case, a suction nozzle to be connected to a suction unit 1238, the operation of which is controlled by the control unit 501, is coupled to the other end of the spline nozzle 1231.

The support member 1214 is thicknesswise movably fitted to a frame 124 of the mounting finishing unit 120 erectly provided on a base plate 102, and moved in the thicknesswise direction by the support-member drive unit 1215 fixed to the frame 124. In addition, the aforementioned three pressure nozzles 123 are thicknesswise movable independently of one another. Also, the number of the pressure nozzles 123 may be any arbitrary number more than one without being limited to the aforementioned three.

The heating device 122, in this embodiment, is implemented by a so-called cartridge heater(s), which is fitted directly to each of the corresponding contact members 1211, for example, along the X direction.

Figure 2:
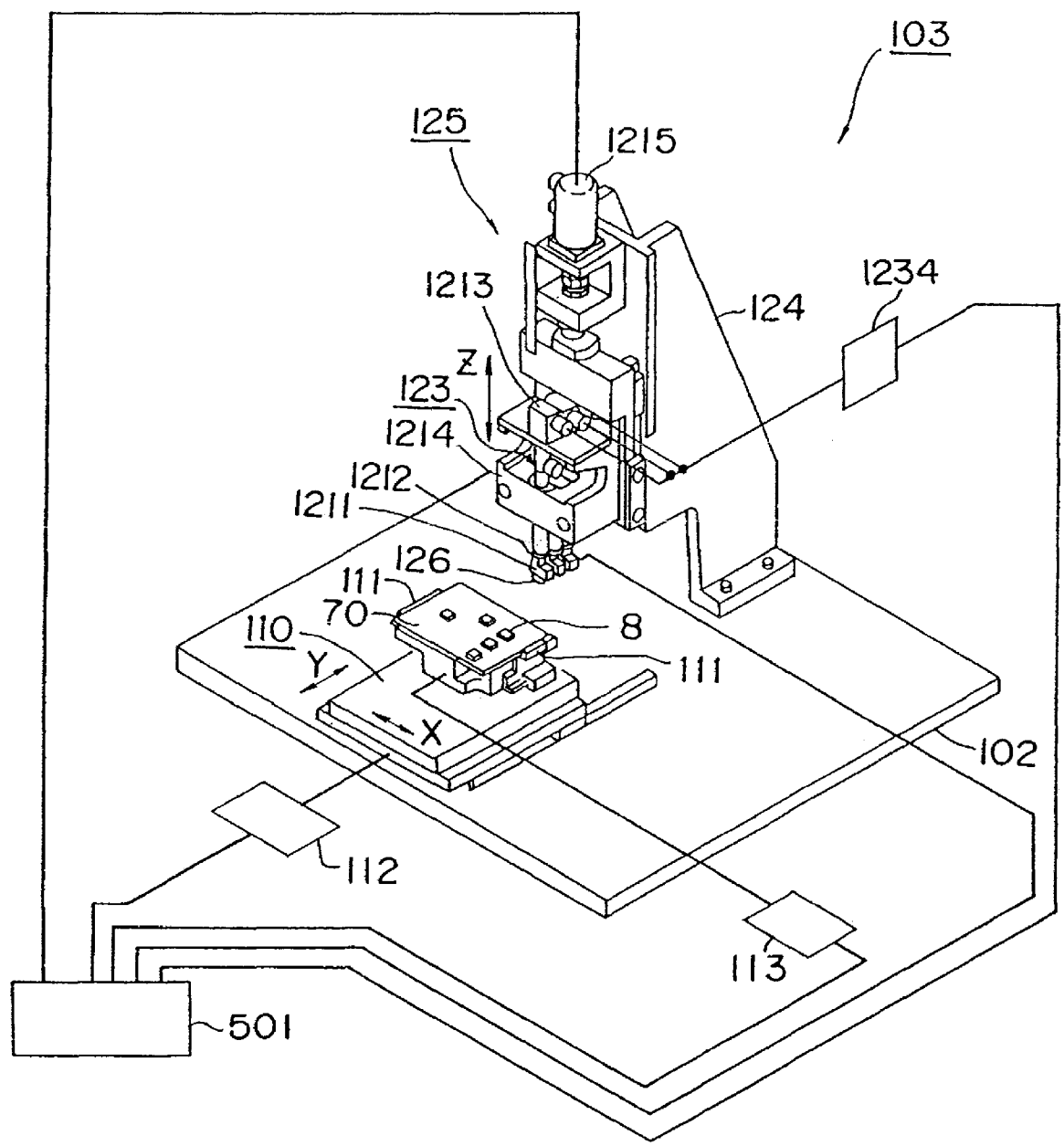
FIG. 2 is a perspective view of a modified example of the heating and pressurizing apparatus shown in FIG. 1.

Also, as a modified example of the heating device 122, a heating device 126 may be fitted to the contact surface of the contact member 1211 as in a mounting finishing unit 125 of a heating and pressurizing apparatus 103 shown in FIG. 2. The heating device 126 like this one is implemented by a so-called ceramic heater, and is capable of performing temperature increasing and cooling operations at higher speeds than the conventional heating device.

The drive unit 112 for the placement table 110, the heating device 113 for the placement table 110, the heating devices 122, the pressurizing-force adjusting mechanisms 1213 and the support-member drive unit 1215 in the mounting finishing unit 120, 125 as described above are each connected to the control unit 501 so that their operations.

Operation of each of the heating and pressurizing apparatus 101 and heating and pressurizing apparatus 103 constituted as described above is explained below. It is noted that the operation control is executed by the control unit 501, and that information necessary for the heating and pressurizing operations as well as positional information in the X, Y directions of the electronic components 8 pre-bonded on the circuit board 70 have previously been stored in the control unit 501.

First, the circuit board 70 on which the electronic components 8 are pre-bonded via the thermosetting bonding element 9 is placed on the placement table 110, and this placement table 110 is moved in the X, Y directions by the operation of the drive unit 112. The circuit board is stopped at a point when the electronic components 8 to be pressurized are located just under the pressure nozzles 123 that pressurize the electronic components 8.

After that, by the operation of the support-member drive unit 1215, the support member 1214 is lowered until the contact surface of the contact member 1211 in the spline nozzle 1231 of each of the pressure nozzles 123 comes into contact with the top of the electronic component 8. Further, the support member 1214 continues being lowered in order to obtain a specified necessary push-in extent to the electronic component 8, more specifically, about 0.1 to 0.2 mm, and comes to a stop when the specified push-in extent is obtained. In addition, the specified push-in extent is detected based on the feed amount of a ball screw constituting the support-member drive unit 1215. In this process, the spline nozzle 1231, by the reaction, pushes up the piston of the air cylinder 1233 on which the air pressure is acting. In this way, the spline nozzle 1231 escapes upward to an extent corresponding to the push-in extent of the support member 1214. The pressurizing force to the electronic component 8 in this case can be controlled by the control unit 501 via the lowering extent of the support-member drive unit 1215. In addition, the pressurizing operation can be controlled by the control unit 501 also based on a pressurizing force obtained by the load cell 1232 fitted to the spline nozzle 1231.

After the support member 1214 has stopped, the pressurizing-force adjusting mechanism 1213 and the heating device 122 operate so that the contact surface of the contact member 1211 obtains specified heating characteristic and pressurizing characteristic. In this process, heating and pressurizing operations are executed with specified times and specified characteristics matching the electronic components 8 to be pressurized, independently and respectively by the individual pressure nozzles 123, by which the bonding elements 9 are finally cured. After that, the support member 1214 moves up again, stopping at the standby position. In addition, differing depending on the bonding method, the specified time is, for example, about 60 seconds, and the heating temperature is, for example, about 200 to 300° C., and differing depending on the size of the electronic components, the pressurizing force is, for example, 1 to 50 Kg.

After that, the placement table 110 moves in such a direction as to go away from the mounting finishing unit 120 or 125, for example, in the Y direction, where the sequence of operations is completed.

As described above, by using the heating and pressurizing apparatus 101, 103, the electronic components 8 pre-bonded onto the circuit board 70 by flip-chip mounting via the thermosetting bonding elements 9 can be post-bonded.

Figure 9:
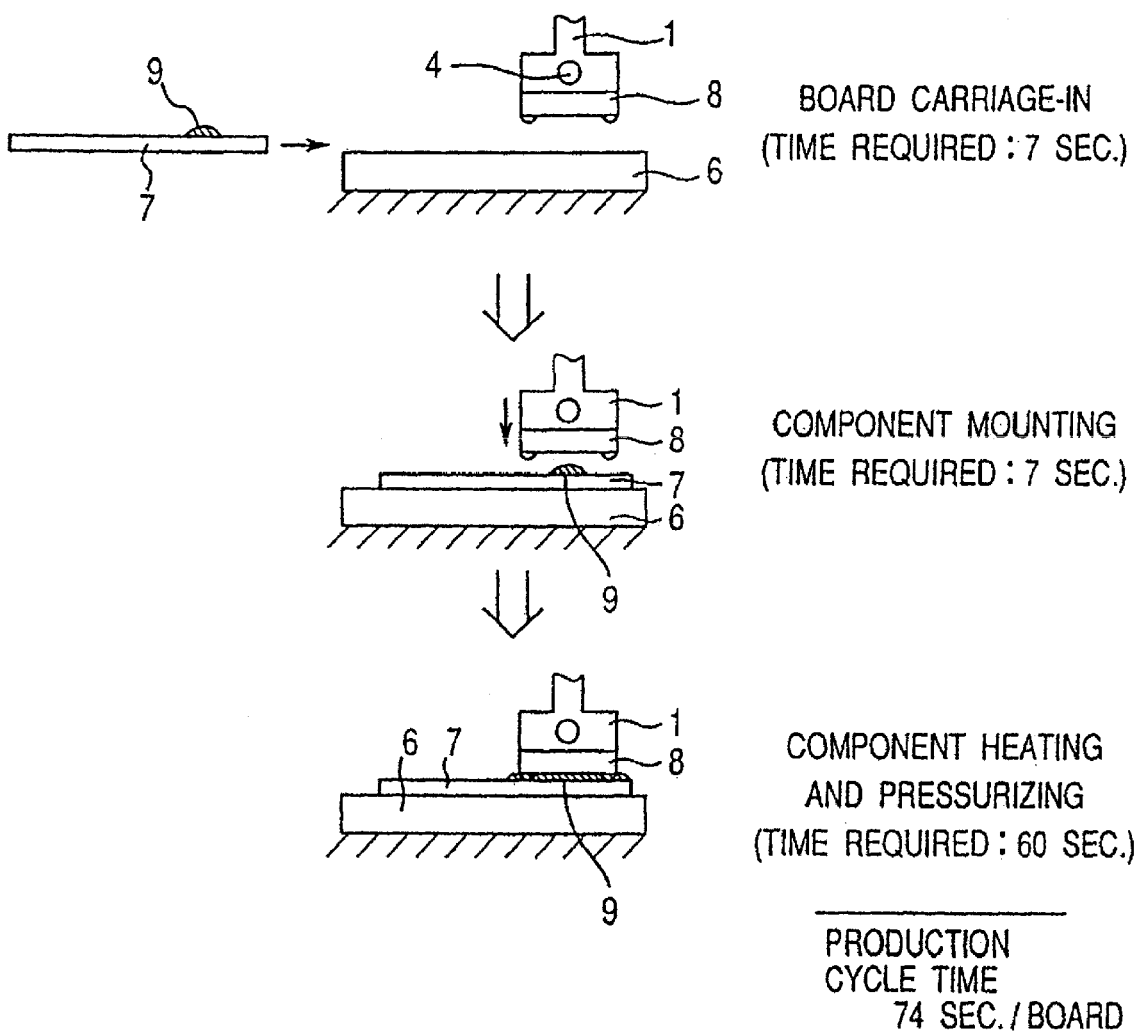
FIG. 9 is a process explanatory view of the flip-chip mounting using the conventional heating and pressurizing technique.

Thus, as compared with the prior art case where the heating and pressurizing operations are executed in succession after the electronic components 8 are pre-bonded onto the circuit board 7 by the flip-chip mounter alone as shown in FIG. 9, the total production cycle time is reduced as described above, so that the productivity per circuit board is improved. That is, in the case of the heating and pressurizing apparatus 101 as an example, the circuit board 70 on which the electronic components 8 have previously been pre-bonded is fed to the heating and pressurizing apparatus 101. In the heating and pressurizing apparatus 101, it takes about 7 seconds to carry in the circuit board 70 with the electronic components 8 pre-bonded thereon from the flip-chip mounter onto the placement table 110, and it takes about 60 seconds to execute the pressurizing and heating operations by the mounting finishing unit 120. Therefore, the heating and pressurizing apparatus 101 goes on producing the circuit boards 70 in about 67 seconds per board. Thus, as described above, the line production cycle time is about 67 seconds per circuit board 70.

As stated above by referring to FIG. 9, whereas the production cycle time would be 74 seconds per circuit board 70 when the pre-bonding and post-bonding of the electronic components 8 are done by the flip-chip mounter alone, the production cycle time becomes 67 seconds for each of the second and following boards in the heating and pressurizing apparatus 101 of this embodiment as described above. Thus, the production cycle time is reduced by about 7 seconds per circuit board 70, as compared with the conventional case. That is, compared with the prior art, the production cycle time goes on being reduced by the degree of about 7 seconds per circuit board 70.

Also, the heating and pressurizing apparatus 103 is able to perform the temperature-increasing and cooling operations at higher speeds than the conventional heating device, by virtue of using a ceramic heater as the heating device 126. Therefore, in the heating and pressurizing process executed by the mounting finishing unit 125, if the temperature increasing and cooling operation comprises a transition of 100° C. to 300° C., a holding time of 30 seconds at 300° C., and a transition of 300° C. to 100° C., then the time required for the temperature increasing and cooling operations can be made every 3 seconds. Thus, the time required for the heating and pressurizing process results in 36 (=3+30+3) seconds. Adding thereto the carriage-in time, 7 seconds, of the circuit board 70 to the heating and pressurizing apparatus 103 as described above results in a production cycle time per circuit board 70 of 43 seconds. Like this, even compared with the case of the heating and pressurizing apparatus 101, the production cycle time is reduced by as much as 24 seconds. In addition, as a result of this, the cycle time of the line to which the pressurizing apparatus for the flip-chip mounter is connected becomes 43 seconds, a reduction of as much as 24 seconds likewise.

Figure 3:
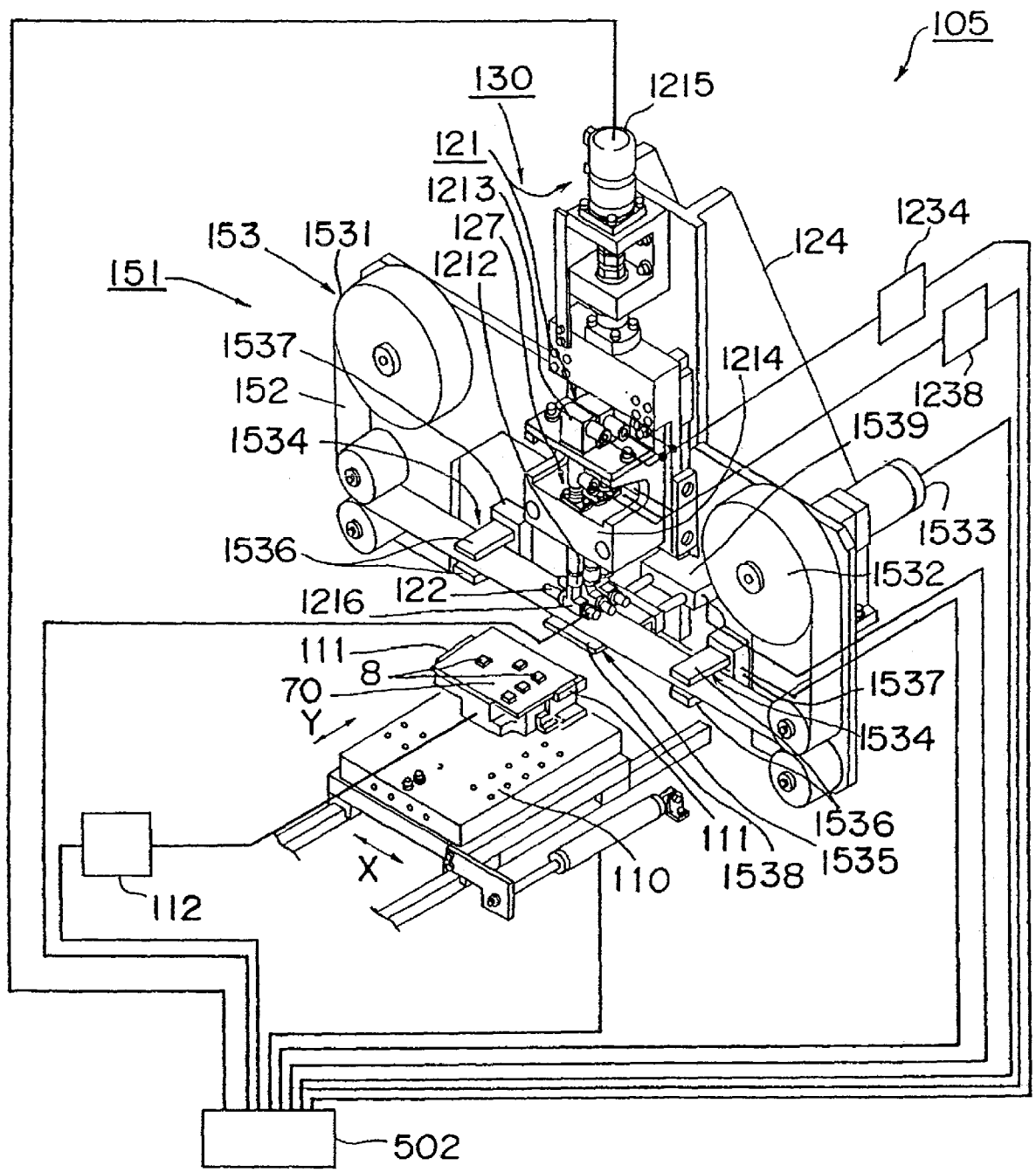
FIG. 3 is a perspective view of another modified example of the heating and pressurizing apparatus shown in FIG. 1.

Furthermore, a heating and pressurizing apparatus 105 as shown in FIG. 3 may be arranged. That is, a mounting finishing unit 130 equivalent in structure to the mounting finishing unit 120 of the aforementioned heating and pressurizing apparatus 101, or the mounting finishing unit 125 of the heating and pressurizing apparatus 103 may be further provided with a contamination preventing unit 151. It is noted that the mounting finishing unit 130 shown in FIG. 3 is provided with pressure nozzles 127 instead of the pressure nozzles 123 in the mounting finishing unit 120 of the heating and pressurizing apparatus 101. The pressure nozzle 127 is equipped with a contact member 1216 having an air passage sucked up by the aforementioned suction unit 1238 instead of the contact member 1211 provided in the pressure nozzles 123.

The contamination preventing unit 151 is a device for preventing the contact member 1216 from being contaminated by the bonding element 9 when the electronic components 8 are heated and pressurized by the contact members 1216 of the pressure nozzles 127. The contamination preventing unit 151 comprises a contamination preventing member 152, and a contamination-preventing member supply unit 153 for supplying the contamination preventing member 152 between the contact surface of the contact member 1216 and the electronic component 8 to be pressurized.

The contamination preventing member 152, in this embodiment, is a strip-shaped sheet material made of, for example, polyimide or Teflon (registered trademark). The contamination-preventing member supply unit 153 has a supply-side reel 1531, a winding-side reel 1532, chuck devices 1534, and a support device 1535. On the supply-side reel 1531, the contamination preventing member 152 that is unused or is usable has been wound up. The winding-side reel 1532 has a motor 1533 to wind up the contamination preventing member 152 sent from the supply-side reel 1531. The chuck devices 1534 are provided on both sides, respectively, of the contact member 1216, with the contact member 1216 interposed therebetween. The chuck devices 1534 each have pinching members 1536 which can pinch the contamination preventing member 152 in a thicknesswise direction, and a drive unit 1537 for the pinching members 1536. The chuck devices 1534 hold the contamination preventing member 152 during the heating and pressurizing operations for the electronic components 8 by the contact members 1216, thus preventing the contamination preventing member 152 from sagging. The support device 1535 is a device for making the contamination preventing member 152 sucked up to the contact members 1216 before the heating and pressurizing operations for the electronic components 8 by the contact members 1216, and the support device 1535 comprises a movable member 1538, and a drive unit 1539 for moving the movable member 1538 in the Z direction and Y direction perpendicular to the X direction that is the direction in which the contamination preventing member 152 is carried. The movable member 1538 is placed by the drive unit 1539 so that the contamination preventing member 152 is positioned, in the above suckup operation, from the standby position to a place below the pressure nozzles 127 and between the movable member 1538 itself and the contact members 1216.

Operation of the heating and pressurizing apparatus 105 constituted as shown above is explained in terms of, mainly, the heating and pressurizing operations for the electronic components 8 by the pressure nozzles 127 of the mounting finishing unit 130.

When the electronic components 8 on the circuit board 70 are heated and pressurized, with the bonding elements 9 cured, so as to be post-bonded, the placement table 110 moves in the X and Y directions, and stops at a point when the electronic components 8 to be pressurized are located just under the pressure nozzles 127 that pressurize the electronic components 8.

After that, the movable member 1538 of the support device 1535 in the contamination preventing unit 151 moves in the Y direction, and stops at the place below the pressure nozzles 127 where the contact members 1216 can make contact with the movable member 1538 via the contamination preventing member 152. Next, the support member 1214 lowers and stops so that the contact members 1216 make contact with the contamination preventing member 152 located at the top of the movable member 1538. Then, the contact members 1216 suck up the contamination preventing member 152 while the pinching members 1536 of the chuck devices 1534 pinch the contamination preventing member 152. After that, the movable member 1538 of the support device 1535 retreats along the Y direction to the standby position where the movable member 1538 goes away from the pressure nozzles 127. Then, the support member 1214 lowers until the contact surfaces of the contact members 1216 come into contact with the tops of the electronic components 8 via the contamination preventing member 152. Further, as in the case of the aforementioned pressure nozzles 123, in order to obtain a specified necessary push-in extent for the electronic components, the support member 1214 continues lowering, and stops at a point when the specified push-in extent is obtained. In this case, the pressure nozzles 127 move upward to an extent corresponding to the push-in extent of the support member 1214 within the support member 1214.

After the support member 1214 has stopped, the pressurizing-force adjusting mechanisms 1213 and the heating devices 122 operate so that the contact surfaces of the contact members 1216 obtain specified heating characteristics and pressurizing characteristics for the electronic components 8. Under the control of the control unit 502, heating and pressurizing operations are executed with specified times and specified characteristics matching the individual electronic components 8 to be pressurized, independently by the individual pressure nozzles 127, so as to post-bond the bonding elements 9. Then, the support member 1214 goes up again, stopping at the specified standby position.

After that, the contact members 1216 stop the suckup of the contamination preventing member 152, and the pinching members 1536 of the chuck devices 1534 stop the pinching operations. Then, the winding-side reel 1532 is driven so that a new contamination preventing member 152 is supplied to below the pressure nozzles 127. Further, the placement table 110 moves in such a direction as to go away from the mounting finishing unit 130, where the sequence of operations is completed.

As shown above, according to the heating and pressurizing apparatus 105, for the process of post-bonding the electronic components 8 that have been pre-bonded on the circuit board 70 by flip-chip mounting via the thermosetting bonding elements 9, heating and pressurizing operations are executed with the intervention of the contamination preventing member 152 so that the bonding elements 9 adhere to the contamination preventing member 152. Thus, the contact surfaces of the contact members 1216 are never contaminated by the bonding elements 9. Further, because the electronic components 8 are post-bonded while the contamination preventing member 152 is pinched by the pair of chuck devices 1534 on both right and left sides of the contact members 1216, the post-bonding operation can be completed without any shift in the mounting positions of the electronic components 8 by virtue of the tension of the contamination preventing member 152. This makes it possible not only to secure the quality of the mounting board products, but also to prevent minor rests as the system, so that the productivity can be improved.

Figure 4:
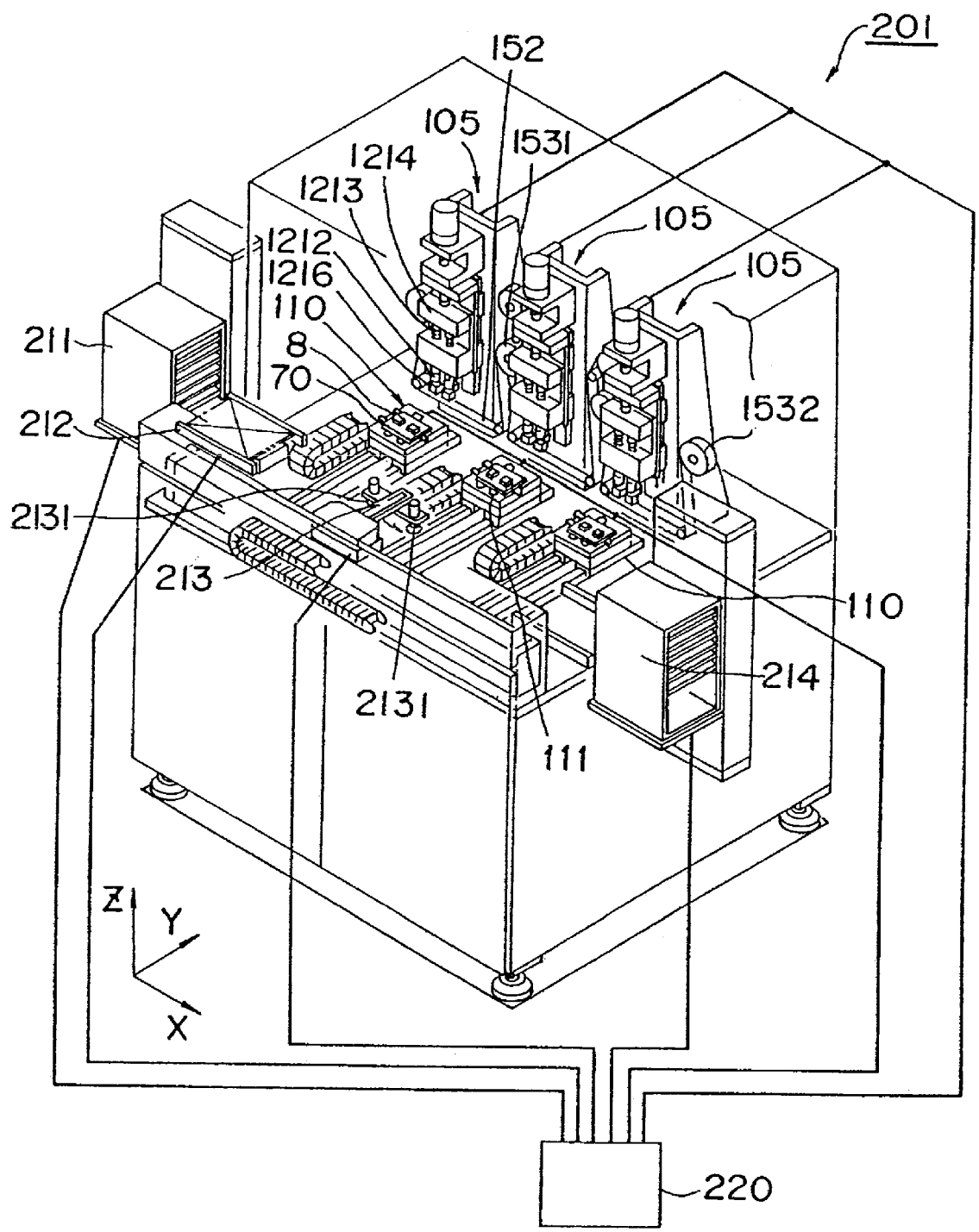
FIG. 4 is a perspective view of a post-bonding unit which is an embodiment of the present invention and which is equipped with the heating and pressurizing apparatus shown in FIG. 3.

Further, FIG. 4 shows the electronic-component post-bonding unit 201 provided in the above electronic component mounting apparatus 601. This electronic-component post-bonding unit 201 is equipped with three heating and pressurizing apparatuses 105 as described above. In addition, the heating and pressurizing apparatus here provided is not limited to the heating and pressurizing apparatus 105 but may be the heating and pressurizing apparatus 101 or the heating and pressurizing apparatus 103 as described above.

The electronic-component post-bonding unit 201 further comprises placement tables 110 corresponding to the individual heating and pressurizing apparatuses 105, a circuit board supply unit 211 for storing in layers and supplying the circuit boards 70 to which electronic components 8 are pre-bonded via the bonding elements 9, a board pre-heating device 212 for placing thereon a circuit board 70 discharged from the circuit board supply unit 211 and then pre-heating the circuit board 70, a board placement device 213, and a circuit board storage 214 for storing therein the circuit boards 70 on which the electronic components 8 have been post-bonded. The heating and pressurizing apparatus 105 and the placement table 110 have already been described above and the description is omitted here.

The circuit board supply unit 211 has a draw-out device for holding and drawing out the circuit board 70 and placing the circuit board 70 onto the board pre-heating device 212. The board placement device 213, having board holding parts 2131 movable in the X direction, transfers the circuit board 70, which has been placed on the board pre-heating device 212, onto the placement table 110. The board placement device 213 also transfers the circuit board 70, to which the electronic components 8 have been post-bonded, from on the placement table 110 to on the draw-out device provided in the circuit board storage 214. In addition, in this embodiment, the board holding parts 2131 hold the circuit board 70 by a sucking operation. Also, when the circuit board 70 is transferred by the board placement device 213 from and to the placement table 110, the placement table 110 moves in the Y direction so as to be placed at a position corresponding to the movement area of the board holding parts 2131. Further, when the circuit board 70 is placed on the placement table 110, the circuit board 70 is positioned onto the placement table 110 by the fixing unit 111 provided in the placement table 1 10. The circuit board storage 214, having the draw-out device as described above, stores in layers the circuit boards 70 which have been placed on the draw-out device by the board placement device 213 and which have the post-bonded electronic components 8.

Moreover, the heating and pressurizing apparatuses 105, the placement tables 110, the board supply unit 211, the board pre-heating device 212, the board placement device 213, and the circuit board storage 214 are connected to a control unit 220 provided in the electronic-component post-bonding unit 201, and so that their operation is controlled by the control unit 220.

An operation of the electronic-component post-bonding unit 201 constructed as described above is explained below.

The circuit board 70 having electronic components 8 to be post-bonded is drawn out by the draw-out device provided in the board supply unit 211, and placed on the board pre-heating device 212. The circuit board 70 is heated by the board pre-heating device 212. When the circuit board 70 has reached a specified temperature by counting a specified time or by measuring the temperature of the circuit board 70 with a temperature sensor, the circuit board 70 is transferred by the board placement device 213 to the placement table 110, which is located in the leftmost place in FIG. 4 as an example, and then fixed by the fixing unit 111. After this fixation, the placement table 110 is moved to just under the pressure nozzles 127 of the heating and pressurizing apparatus 105, which is located in the leftmost place in FIG. 4. After this, the electronic components 8 are post-bonded onto the circuit board 70 by the above-described operation of the heating and pressurizing apparatus 105.

Assuming that one heating and pressurizing apparatus 105 and one placement table 110 are taken as a set, because three sets each comprised of the heating and pressurizing apparatus 105 and one placement table 110 are provided in this embodiment, the next-processed circuit board 70 is placed on the board pre-heating device 212 and pre-heated while the electronic components 8 are post-bonded by the heating and pressurizing apparatus 105 located in the leftmost place as stated above. Then, when the pre-heating operation is completed, the circuit board 70 is placed by the board placement device 213 onto a placement table 110 corresponding to an empty heating and pressurizing apparatus 105 (i.e., contains no board 70) that is out of operating state and located in the second or third place from the left in FIG. 4. Then, as in the operation of the above-described heating and pressurizing apparatus 105 located in the leftmost place, the operation of post-bonding the electronic components 8 is executed at the apparatus 105.

Meanwhile, the placement table 110 moves along the Y direction to within the movement area of the board placement device 213, for example, at the time point when the operation of post-bonding the electronic components 8 is completed by the heating and pressurizing apparatus 105 placed in the leftmost place in FIG. 4. Then, the operation of fixing the circuit board 70 by the fixing unit 111 is released, and the circuit board 70 is transferred to the draw-out device of the circuit board storage 214 by the board placement device 213, where the circuit board 70 is stored in the circuit board storage 214 by the draw-out device. After this, the heating and pressurizing apparatuses 105 placed in the second or third place from the left are processed.

Then, the circuit boards 70 are supplied to the emptied heating and pressurizing apparatuses 105 in succession, and the operation of post-bonding the electronic components 8 is completed successively.

As shown above, according to the electronic-component post-bonding unit 201 of this embodiment, the electronic components 8 flip-chip-mounted onto the circuit board 70 via the thermosetting bonding elements 9 can be post-bonded with high efficiency. By coupling such an electronic-component post-bonding unit 201 to the flip-chip mounter, mass production of the flip-chip mounting onto the circuit boards 7 can be achieved with high productivity. Also, when the production cycle time of the flip-chip mounter, which is pre-processing equipment, is of high speed, the productivity of the electronic-component post-bonding unit 201 can be enhanced by increasing the number of sets each comprised of the placement table 110 and the heating and pressurizing apparatus 105 provided in the electronic-component post-bonding unit 201. Thus, by matching the flip-chip mounter which is pre-processing equipment, to the production cycle time, the whole line of equipment can be operated with high efficiency so that a high productivity can be secured.

FIG. 10 is a perspective view showing a specified electronic component mounting apparatus of FIG. 5, wherein the final fixing unit 201 shown in FIG. 4 and the flip-chip mounter 301 shown in FIG. 7 are directly connected via the carrying unit 401. In FIG. 10, reference numeral 29 indicates a pallet on which a plurality of circuit boards are placed for carrying them. Each pallet 29 is carried out from the flip-chip mounter 301 while the plurality of circuit boards 70 (for example, two circuit boards 70) with the components 8 pre-bonded thereon are placed on each pallet 29. Then, each pallet 29 is carried to the final fixing unit 201 by the carrying unit 401 constituted of a pair of rail type carrying members 401 a between which the boards 70 are held for carrying them. Similarly to the above-described carrying operation in FIG. 4, each board 70 placed on the pallet 29 is placed on the placement table 110 corresponding to the empty heating and pressurizing apparatus 105 by the board placement device 213. The control unit 500 receives a detection signal outputted from a board detection sensor arranged at the placement table 110 which detects the presence of the board 70 on the placement table 110, and the control unit 500 decides based on the signal whether the heating and pressurizing apparatus 105 is empty or not. Therefore, it can prevent the carried circuit board 70 and the placed circuit board 70 from overlapping one another on the placement table 110 and prevent the carried circuit board 70 from coming into contact with another circuit board 70. In the case of FIG. 4, the similar board presence detecting operation can be performed by the control unit 220 while using the sensor. As shown in FIG. 10, just before the circuit boards 70 are carried into the electronic-component post-bonding unit 201, the carried circuit boards 70 on the pallet 29 may be pre-heated by the board pre-heating device 212. The circuit boards 70 on which the post-bonding has been completed may be accommodated into the circuit board storage 214 as shown in FIG. 10, or alternately, may be carried to the sequential process by a carrying unit similar to the carrying unit 401 or another carrying unit.

In FIG. 10, since the distance between the pair of rail type carrying members 401 a is larger than the width of each circuit board 70, each of the circuit boards 70 is placed on the pallet 29 and then the pallet 29 is carried by the carrying unit 401. The present invention is not limited to this, but when the distance between pair of rail type carrying members 401 a is equal to the width of each circuit board 70, it is unnecessary to use the pallet 29.

Here, the difference between the pre-bonding and the post-bonding processes are described below. Basically, the pre-bonding process is a process to hold the component on the circuit board in such an extent not to shift the component on the board during the post-bonding process, while the post-bonding is to completely fix the component onto the board.

Figure 11A:
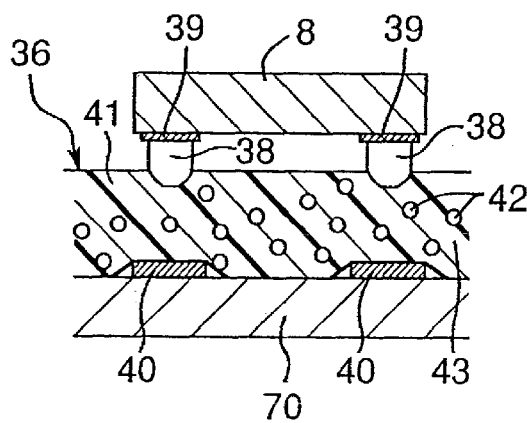
FIGS. 11A and 11B are explanatory views showing a state where the pre-bonding process is performed and a state where the post-bonding process is performed in a case where an ACF is used.
Figure 11B:
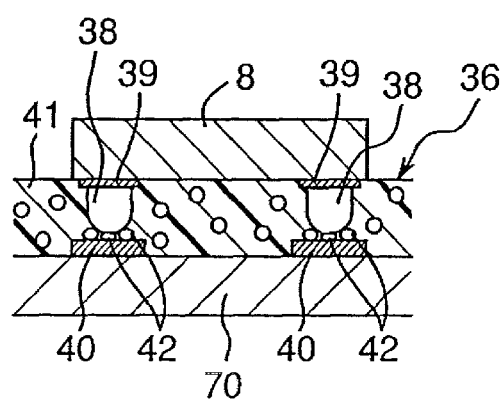

FIGS. 11A and 11B show a case where ACF (Anisotropic Conductive Film) 36 which comprises conductive golden particles 42 in an insulating resin layer 43 is held between the component such as IC 8 and the circuit board 70 to connect the IC 8 and the circuit board 70 via the golden particles 42, which is used, for example, in a COG (Chip-On-Glass) method. FIG. 11A shows a state after the pre-bonding process is performed. That is, in FIG. 11A, the golden particles 42 are not sufficiently held between bumps 38 formed on electrodes 39 of the IC 8 and electrodes 40 of the circuit board 70, so that the electrodes 39 of the IC 8 are not electrically connected to the electrodes 40 of the circuit board 70. In FIG. 11A, the IC 8 is temporarily positioned at a specified position on the circuit board 70 by the insulating resin layer 43. Since the insulating resin layer 43 is hardly (not significantly) cured, the bonding between the IC 8 and the circuit board 70 are insufficiently performed. FIG. 11B shows a state after the post-bonding process is performed after the pre-bonding process, wherein the golden particles 42 are sufficiently held between the bumps 38 formed on the electrodes 39 of the IC 8 and the electrodes 40 of the circuit board 70 and broken therebetween. Thus, the electrodes 39 of the IC 8 are electrically connected to the electrodes 40 of the circuit board 70 via the broken golden particles 42. In FIG. 11B, the IC 8 is surely positioned at the specified position by the cured insulating resin layer 43. Since the insulating resin layer 43 has been cured more than a specified curing state for surely connecting the electrodes 38, 40 of the IC 8 and the circuit board 70 via the particles 42, the bonding between the IC 8 and the circuit board 70 are sufficiently performed.

Figure 12A:
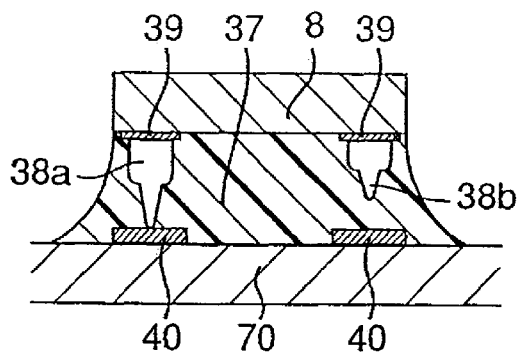
FIGS. 12A and 12B are explanatory views showing a state where the pre-bonding process is performed and a state where the post-bonding process is performed in a case where an adhesive is used.
Figure 12B:
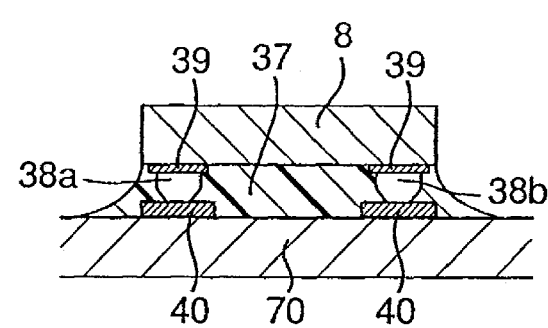

On the other hand, FIGS. 12A and 12B show a case where, without using the ACF, an adhesive 37 is located between the component such as IC 8 and the circuit board 70 to connect the IC 8 and the circuit board 70 while the electrodes 39, 40 of the IC 8 and the circuit board 70 are connected via bumps 38a, 38b formed on the electrodes 39 of the IC 8. FIG. 12A shows a state after the pre-bonding process is performed, wherein a portion of the bumps are broken but the remaining bumps are not broken between the electrodes 39 of the IC 8 and the electrodes 40 of the board 70. Some of the bumps, for example, the bump 38a on the left side of FIG. 12A, come in contact with the electrode 40 of the board 70, but the remaining portion of the bumps, for example, the bump 38b on the right side of FIG. 12A, do not come in contact with the electrode 40 of the board 70. In FIG. 12A, the IC 8 is temporarily positioned at a specified position on the circuit board 70 by the adhesive 37. Since the broken amount of each of the bumps 38a, 38b does not reach a specified final broken amount and thus the bonding force does not reach a specified final value as a reference, the bonding between the IC 8 and the circuit board 70 is insufficiently performed. Thus, if any external force is applied to the IC 8 or the circuit board 70 in the above pre-bonding state, the IC 8 may be shifted from the specified position on the circuit board 70. FIG. 12B shows a state after the post-bonding process is performed after the pre-bonding process, wherein all of the bumps 38a, 38b are broken between the electrodes 39 of the IC 8 and the electrodes 40 of the board circuit 70 and the large areas of the ends of the bumps 38a, 38b surely bring into contact with the electrodes 40 of the circuit board 70. In such a state of FIG. 12B, the adhesive 37 is completely cured between the IC 8 and the circuit board 70. Thus, the broken amount of each of the bumps 38a, 38b reaches the specified final broken amount and the bonding force reaches the specified final value as the reference. Thus, even though any external force is applied to the IC 8 or the board 70 in the above post-bonding state, the IC 8 can not be shifted from the specified position on the circuit board 70.

Specific examples of the conditions of the pre-bonding and post-bonding processes are as follows. In the case where the ACF is used, the pressurizing force, the pressurizing time, and the pressurizing temperature of the pre-bonding are 30-50 g/bump, 1-2 sec, and 2° C., and the pressurizing force, the pressurizing time, and the pressurizing temperature of the post-bonding are 100-150 g/bump, 20-30sec, and 180° C. In the case where the adhesive is used, the pressurizing force, the pressurizing time, and the pressurizing temperature of the pre-bonding are 50-100 g/bump, 5-10 sec, and 100° C., and the pressurizing force, the pressurizing time, and the pressurizing temperature of the post-bonding are 100-150 g/bump, 10-20 sec, and 150-200° C.

In this embodiment, the mounting finishing units 120, 125, 130 are fixed while the placement tables 110 are movable. However, the constitution is not limited to this, and both the mounting finishing unit and the placement tables may be provided so as to be movable.

As described in detail above, according to the electronic component mounting method in the first aspect of the invention and to the electronic component mounting apparatus in the second aspect of the invention, the pre-bonding process of electronic components to the circuit board and the post-bonding process of heating and pressurizing the electronic components against the circuit board are separated from each other. The circuit board, to which the electronic components have been pre-bonded with bonding elements, is fed to the post-bonding unit. Therefore, the post-bonding unit has only to perform the operation of heating and pressurizing the electronic components, eliminating the need for performing the heating and pressurizing operations with a long time taken, and the need for using expensive equipment capable of flip-chip-mounting the electronic components onto the circuit board with high precision and high speed, unlike would be involved in the prior art. Thus, the flip-chip mounter is required only to perform the mere pre-bonding of the electronic components onto the circuit board, making it possible to make the best use of the high production cycle efficiency of the flip-chip mounter. Like this, the circuit board, to which the electronic components have been pre-bonded, is produced and fed to the post-bonding unit in shorter time than the time required for the post-bonding of the electronic components, so that the production cycle time as a mounting line results in the operating time of the post-bonding unit. Accordingly, the productivity of the whole mounting line can be enhanced and, as compared with the conventional method of production by the flip-chip mounter alone, the mounting cost per mounting board can be remarkably reduced, in terms of the total equipment investment for the flip-chip mounter and the heating and pressurizing apparatus as well as their productivities, which allows the area productivity to be remarkably improved.

Also, according to the electronic-component heating and pressurizing apparatus in the third aspect of the invention, a circuit board to which electronic components have been pre-bonded via bonding elements, is fed to the mounting finishing unit. Therefore, the mounting finishing unit has only to perform the process of heating and pressurizing the electronic components, eliminating the need for performing the heating and pressurizing processes with a long time taken, and the need for using expensive equipment capable of flip-chip-mounting electronic components onto the circuit board with high precision and high speed, unlike would be involved in the prior art. Thus, the high production cycle efficiency of the flip-chip mounter can be drawn out to the best.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electronic component mounting method comprising:
   pre-bonding an electronic component onto a board via a bonding element by using a pre-bonding unit;
   controlling a transfer of the board having the electronic component pre-bonded thereon from the pre-bonding unit to an empty placement table of one of a plurality of heating and pressurizing units of an electronic component post-bonding unit separate from the pre-bonding unit, the empty placement table having no board thereon, said controlling being performed by a control unit, each of the plurality of heating and pressurizing units including a distinct and independently operable set comprised of a respective placement table and a respective mounting finishing unit;
   supporting the board having the electronic component pre-bonded thereon by the previously-empty placement table; and
   post-bonding the pre-bonded electronic component onto the board by independently heating the pre-bonded electronic component on the board supported by the previously-empty placement table of the post-bonding unit using the respective mounting finishing unit separate from the placement table, and further pressurizing the pre-bonded electronic component in a direction of thickness of the board using the respective mounting finishing unit;
   wherein said post-bonding by the post-bonding unit is performed independent of, and simultaneously with, said pre-bonding by the pre-bonding unit.

2. The electronic component mounting method of claim 1, further comprising carrying the board having the electronic component pre-bonded thereon from the pre-bonding unit to the post-bonding unit using a carrying unit.

3. The electronic component mounting method of claim 1, wherein the mounting finishing unit of each of the heating and pressurizing units includes a pressurizing device and a heating device, the pressurizing device having a contact member with a contact surface to be brought into contact with the pre-bonded electronic component, said post-bonding further comprising:
   moving the contact member in a direction of thickness of the board using the pressurizing device so as to press the pre-bonded electronic component against the board; and
   heating the contact member using the heating device to post-cure the bonding element.

4. The electronic component mounting method of claim 3, wherein said post-bonding including said heating and said pressurizing is performed while the contact member, the heating device, and the pressurizing device are interconnected to form a finishing set, the mounting finishing unit of each of the heating and pressurizing units including a distinct and independently operable set comprised of a respective contact member, a respective heating device, and a respective pressurizing device.

5. The electronic component mounting method of claim 3, wherein said heating of said post-bonding is performed by the heating device comprising a ceramic heater.

6. The electronic component mounting method of claim 1, wherein said controlling comprises controlling said transfer of the board to one of the heating and pressurizing units based on a post-bonding processing time being larger than a pre-bonding processing time so as to thereby minimize a total bonding processing time when processing multiple boards and components.

7. The electronic component mounting method of claim 1, wherein said pre-bonding comprises pre-bonding a plurality of electronic components onto boards, said controlling comprising controlling a transfer of each of the boards having at least one of the electronic components pre-bonded thereon to an empty placement table of one of the plurality of heating and pressurizing units in succession.

8. The electronic component mounting method of claim 1, wherein an amount of time required for said post-bonding is greater than an amount of time required for said pre-bonding.

* * * * *